US012581919B2

(12) United States Patent
Kim et al.

(10) Patent No.: US 12,581,919 B2
(45) Date of Patent: Mar. 17, 2026

(54) NONVOLATILE MEMORY DEVICES AND MEMORY SYSTEMS INCLUDING THE SAME

(71) Applicant: Samsung Electronics Co., Ltd., Suwon-si (KR)

(72) Inventors: Do Hyung Kim, Suwon-si (KR); Ji Young Kim, Suwon-si (KR); Ji Won Kim, Suwon-si (KR); Suk Kang Sung, Suwon-si (KR); Woo Sung Yang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 485 days.

(21) Appl. No.: 18/322,714

(22) Filed: May 24, 2023

(65) Prior Publication Data

US 2024/0079280 A1 Mar. 7, 2024

(30) Foreign Application Priority Data

Sep. 6, 2022 (KR) ........................ 10-2022-0112690

(51) Int. Cl.
*H01L 21/66* (2006.01)
(52) U.S. Cl.
CPC .................................... *H01L 22/34* (2013.01)
(58) Field of Classification Search
CPC ......... G11C 16/06; H10B 43/35; H10B 43/40
See application file for complete search history.

(56) References Cited

U.S. PATENT DOCUMENTS

| | | | |
|---|---|---|---|
| 10,748,915 B2 | 8/2020 | Nojima et al. | |
| 11,031,308 B2 | 6/2021 | Lee et al. | |
| 11,195,587 B2 | 12/2021 | Son et al. | |
| 11,309,256 B2 | 4/2022 | Lee et al. | |
| 11,309,394 B2 | 4/2022 | Haraguchi | |
| 2021/0027297 A1 | 1/2021 | Wall et al. | |
| 2021/0066280 A1* | 3/2021 | Park ........................ H01L 24/08 |
| 2021/0082896 A1 | 3/2021 | Harashima et al. | |
| 2022/0084859 A1* | 3/2022 | Son ........................ H10B 41/10 |
| 2022/0085003 A1* | 3/2022 | Iwashita ................. H01L 24/20 |
| 2022/0108926 A1 | 4/2022 | Pachamuthu et al. | |
| 2022/0157754 A1* | 5/2022 | Park ........................ H01L 24/08 |

* cited by examiner

*Primary Examiner* — Mounir S Amer
(74) *Attorney, Agent, or Firm* — Wolf, Greenfield & Sacks, P.C.

(57) ABSTRACT

There is provided a nonvolatile memory device having improved crack detection reliability. The nonvolatile memory device comprises word lines that extend in a first direction, cell contact plugs that are electrically connected to the word lines and extend in a second direction intersecting the first direction, a net crack detection circuit that is on the word lines and is not in contact with the word lines, and a ring crack detection circuit that is on the word lines and is not in contact with the word lines, wherein the net crack detection circuit is electrically connected to a crack detection transistor in a peripheral circuit region, the ring crack detection circuit includes a first crack detection metal wiring that extends in a third direction intersecting the first direction and the second direction, and a second crack detection metal wiring that extends in the third direction.

20 Claims, 9 Drawing Sheets

Ring CDC    MCAR

Net CDC

Y
↑
⊙ → X
Z

2003A

I - I'

NONVOLATILE MEMORY DEVICES AND MEMORY SYSTEMS INCLUDING THE SAME

CROSS-REFERENCE TO RELATED APPLICATION

This application claims priority from Korean Patent Application No. 10-2022-0112690 filed on Sep. 6, 2022 in the Korean Intellectual Property Office, and all the benefits accruing therefrom under 35 U.S.C. 119, the contents of which in its entirety are herein incorporated by reference.

BACKGROUND

1. Technical Field

The present invention relates to nonvolatile memory devices and memory systems including the same.

2. Description of the Related Art

In a data storage system that requires data storage, there is a need for a nonvolatile memory device that may store large amounts of data. Accordingly, research capable of increasing the data storage capacity of the nonvolatile memory device is being conducted. For example, as one method for increasing the data storage capacity of the nonvolatile memory device, a semiconductor device including memory cells arranged three-dimensionally instead of memory cells arranged two-dimensionally is proposed.

SUMMARY

Aspects of the present invention provide nonvolatile memory devices having improved crack detection reliability.

Aspects of the present invention also provide memory systems including the nonvolatile memory device having improved crack detection reliability.

However, aspects of the present invention are not restricted to the ones set forth herein. The above and other aspects of the present invention will become more apparent to one of ordinary skill in the art to which the present invention pertains by referencing the detailed description of the present invention given below.

According to some embodiments of the present disclosure, there is provided a nonvolatile memory device comprising a plurality of word lines that extend in a first direction, a plurality of cell contact plugs that are electrically connected to the plurality of word lines and extend in a second direction intersecting the first direction, a net crack detection circuit that is on the plurality of word lines and is not in contact with the plurality of word lines, and a ring crack detection circuit that is on the plurality of word lines and is not in contact with the plurality of word lines, wherein the net crack detection circuit is electrically connected to a crack detection transistor in a peripheral circuit region, the ring crack detection circuit includes a first crack detection metal wiring that extends in a third direction intersecting the first direction and the second direction, and a second crack detection metal wiring that extends in the third direction, and the first crack detection metal wiring is on the plurality of word lines and is not in contact with the plurality of word lines, and the second crack detection metal wiring is in the peripheral circuit region.

According to some embodiments of the present disclosure, there is provided a nonvolatile memory device comprising a substrate that extends in a first direction, a plurality of lower metal patterns spaced apart from the substrate in the first direction, a plurality of I/O contact plugs that are electrically connected to the plurality of lower metal patterns and extend in a second direction intersecting the first direction, and a net crack detection circuit and a ring crack detection circuit between respective ones of the plurality of I/O contact plugs, wherein the net crack detection circuit is electrically connected to a crack detection transistor in a peripheral circuit region, and wherein the ring crack detection circuit includes a first crack detection metal wiring that extends in a third direction intersecting the first direction and the second direction, and a second crack detection metal wiring that extends in the third direction.

According to some embodiments of the present disclosure, there is provided a memory system comprising a nonvolatile memory device and a controller that is configured to control the nonvolatile memory device, wherein the nonvolatile memory device comprises a plurality of word lines that extend in a first direction, a plurality of cell contact plugs that are electrically connected to the plurality of word lines and extend in a second direction intersecting the first direction, a net crack detection circuit that is on the plurality of word lines and is not in contact with the plurality of word lines, and a ring crack detection circuit that is on the plurality of word lines and is not in contact with the plurality of word lines, wherein the net crack detection circuit is electrically connected to a crack detection transistor in a peripheral circuit region, wherein the ring crack detection circuit includes a first crack detection metal wiring that extends in a third direction intersecting the first direction and the second direction, and a second crack detection metal wiring that extends in the third direction, and wherein the first crack detection metal wiring is on the plurality of word lines and is not in contact with the plurality of word lines, and wherein the second crack detection metal wiring is in the peripheral circuit region.

Specifics of other example embodiments are included in the detailed description and drawings.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
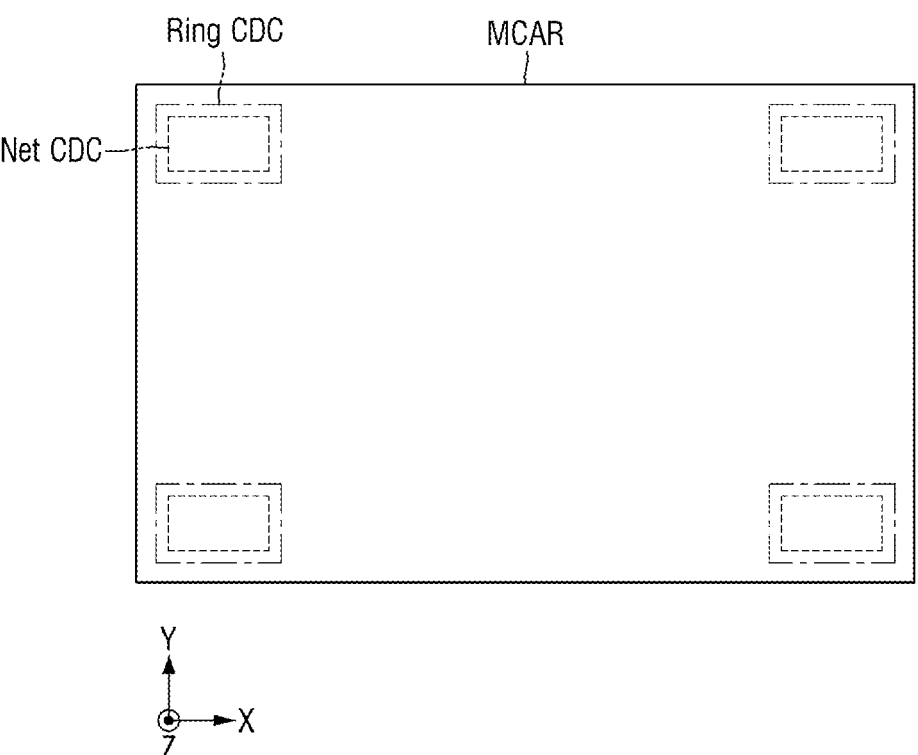
FIG. 1 is a top view of a nonvolatile memory device according to some embodiments.

FIG. 1 is a top view of a nonvolatile memory device according to some embodiments.

The nonvolatile memory device according to some embodiments may include a memory cell array region MCAR including a plurality of memory cells.

At this time, the memory cell array region MCAR may include elements (Net CDC and Ring CDC) for detecting defects of the nonvolatile memory device.

The elements (Net CDC and Ring CDC) for detecting defects of the nonvolatile memory device may be, for example, crack detection circuits. The crack may be, for example, a physical defect caused while bonding a periph- eral circuit region and a cell region of a nonvolatile memory device, which will be described below. Hereinafter, the elements (Net CDC and Ring CDC) for detecting defects of the nonvolatile memory device will be assumed to be crack detection circuits.

The crack detection circuit may include a net crack detection circuit (Net CDC) and a ring crack detection circuit (Ring CDC). Although the net crack detection circuit (Net CDC) and the ring crack detection circuit (Ring CDC) have a rectangular shape in a top view, the present invention is not limited thereto. The net crack detection circuit (Net CDC) and the ring crack detection circuit (Ring CDC) may be in the shape of a closed form (e.g., a circle, etc.) in the top view.

Also, although the net crack detection circuit (Net CDC) is shown to be included in the ring crack detection circuit (Ring CDC), the present invention is not limited thereto, and the net crack detection circuit (Net CDC) may have a shape that surrounds the ring crack detection circuit (Ring CDC).

The net crack detection circuit (Net CDC) and the ring crack detection circuit (Ring CDC) may be formed any- where in the memory cell array region MCAR as long as metal wiring electrically connected to the memory cell array is not formed.

For example, the net crack detection circuit (Net CDC) and the ring crack detection circuit (Ring CDC) may be formed in a dummy bit line region that is not electrically connected to the memory cell array, in the memory cell array region MCAR.

Hereinafter, a specific structure in which the net crack detection circuit (Net CDC) and the ring crack detection circuit (Ring CDC) are formed will be described.

Figure 2:
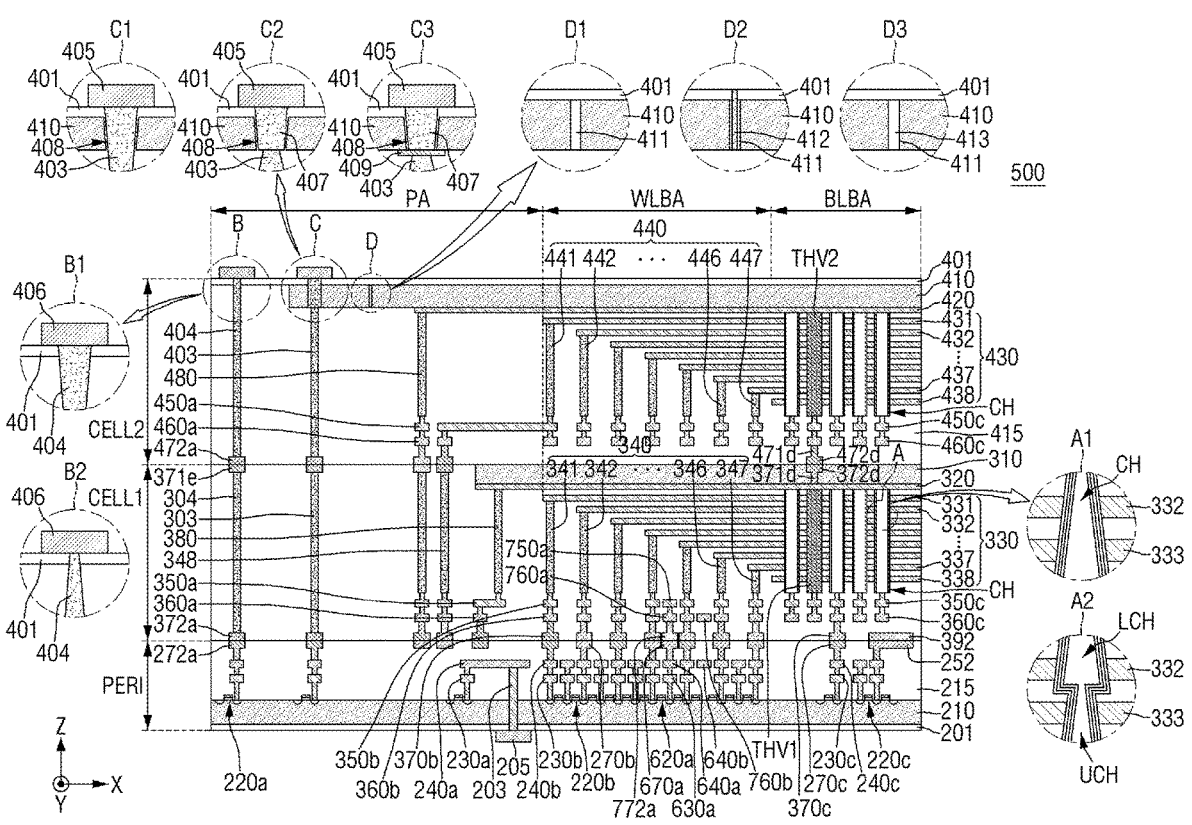
FIG. 2 is a cross-sectional view for explaining a nonvolatile memory device according to some embodiments.

FIG. 2 is a cross-sectional view for explaining a nonvola- tile memory device according to some embodiments.

Referring to FIG. 2, a nonvolatile memory device 500 may have a C2C (chip-to-chip) structure. Here, the C2C structure may mean a structure in which at least one upper chip including a cell region CELL and a lower chip includ- ing a peripheral circuit region PERI are fabricated, respec- tively, and then the at least one upper chip and the lower chip are connected to each other by a bonding method.

As an example, the bonding method may mean a method of electrically or physically connecting a bonding metal pattern formed on the uppermost metal layer of the upper chip and a bonding metal pattern formed on the uppermost metal layer of the lower chip.

For example, when the bonding metal pattern is formed of copper (Cu), the bonding method may be a Cu—Cu bonding method. As another example, the bonding metal pattern may be formed of aluminum (Al) or tungsten (W).

The nonvolatile memory device 500 may include at least one or more upper chips including the cell region. For example, as shown in FIG. 2, the nonvolatile memory device 500 may be implemented to include two upper chips CELL1 and CELL2.

However, this is an example, and the number of upper chips is not limited thereto. When the nonvolatile memory device 500 is implemented to include two upper chips, after fabricating each of a first upper chip including a first cell region CELL', a second upper chip including a second cell region CELL2, and a lower chip including the peripheral circuit region PERI, by connecting the first upper chip, the second upper chip, and the lower chip to each other by the bonding method, the nonvolatile memory device 500 may be fabricated.

The first upper chip may be inverted and connected to the lower chip by the bonding method, and the second upper chip may also be inverted and connected to the first upper chip by the bonding method.

In the following description, the top and bottom of the first and second upper chips are defined on the basis of the status before the first upper chip and the second upper chip are converted. That is, in FIG. 2, the upper part of the lower chip means an upper part defined on the basis of a +Z-axis direction, and the upper parts of each of the first and second upper chips mean upper parts defined on the basis of a −Z-axis direction. However, this is an example, and only one of the first upper chip and the second upper chip may be inverted and connected by the bonding method.

Each of the peripheral circuit region PERI and the first and second cell regions CELL1 and CELL2 of the nonvola- tile memory device 500 may include an external pad bond- ing region PA, a word line bonding region WLBA, and a bit line bonding region BLBA.

The peripheral circuit region PERI may include a first substrate 210, and a plurality of circuit elements 220a, 220b, 220c, and 620a formed on the first substrate 210. An interlayer insulating layer 215 including one or more insu- lating layers may be provided on the plurality of circuit elements 220a, 220b, 220c, and 620a, and a plurality of metal wirings for connecting the plurality of circuit elements 220a, 220b, 220c, and 620a may be provided inside the interlayer insulating layer 215. For example, the plurality of metal wirings may include first metal wirings 230a, 230b, 230c, and 630a connected to each of the plurality of circuit elements 220a, 220b, 220c, and 620a, and second metal wirings 240a, 240b, 240c and 640a formed on the first metal wirings 230a, 230b, 230c, and 630a.

The plurality of metal wirings may be made up of at least one of various conductive materials. For example, the first metal wirings 230a, 230b, 230c, and 630a may be formed of tungsten, which has a relatively high electrical resistivity, and the second metal wirings 240a, 240b, 240c, and 640a may be formed of copper, which has a relatively low electrical resistivity.

In this specification, although only the first metal wirings 230a, 230b, 230c, and 630a and the second metal wirings 240a, 240b, 240c, and 640a are shown and described, embodiments are not limited thereto, and at least one or more additional metal wirings may be further formed on the second metal wirings 240a, 240b, 240c, and 640a.

In this case, the second metal wirings 240a, 240b, 240c and 640a may be formed of aluminum. At least some of the additional metal wirings formed on the second metal wirings 240a, 240b, 240c, and 640a may be made of copper or the like which has electrical resistivity lower than that of aluminum of the second metal wirings 240a, 240b, 240c, and 640a.

An interlayer insulating layer 215 is disposed on the first substrate 210 and may include an insulating material such as silicon oxide or silicon nitride.

Each of the first and second cell regions CELL1, CELL2 may include at least one memory block. The first cell region CELL1 may include a second substrate 310 and a common source line 320. A plurality of word lines (331 to 338; 330) may be stacked on the second substrate 310 along a direction perpendicular to the upper side of the second substrate 310 (Z-axis direction). String selection lines and ground selection lines may be disposed above and below the word lines 330, and the plurality of word lines 330 may be disposed between the string selection line and the ground selection line. Similarly, the second cell region CELL2 includes a third substrate 410 and a common source line 420, and a plurality of word lines (431 to 438: 430) may be stacked along a direction (Z-axis direction) perpendicular to the upper side of the third substrate 410. The second substrate 310 and the third substrate 410 may be formed of various materials, and may be, for example, a silicon substrate, a silicon-germanium substrate, a germanium substrate, or a substrate having a monocrystalline epitaxial layer grown on a monocrystalline silicon substrate. A plurality of channel structures CH may be formed in each of the first and second cell regions CELL1 and CELL2.

In some embodiments, as shown in A1, the channel structure CH is provided in the bit line bonding region BLBA and extends in a direction perpendicular to the upper side of the second substrate 310 to penetrate or extend into the word lines 330, the string selection lines, and the ground selection lines. The channel structure CH may include a data storage layer, a channel layer, a buried insulating layer, and the like. The channel layer may be electrically connected to the first metal wiring 350c and the second metal wiring 360c in the bit line bonding region BLBA. For example, the second metal wiring 360c may be a bit line, and may be connected to the channel structure CH through the first metal wiring 350c. The bit line 360c may extend along the first direction (Y-axis direction) parallel to the upper side of the second substrate 310.

In some embodiments, as shown in A2, the channel structure CH may include a lower channel LCH and an upper channel UCH connected to each other. For example, the channel structure CH may be formed through a process for the lower channel LCH and a process for the upper channel UCH. The lower channel LCH may extend in a direction perpendicular to the upper side of the second substrate 310, and may penetrate or extend into the common source line 320 and the lower word lines 331 and 332. The lower channel LCH may include a data storage layer, a channel layer, a buried insulating layer, and the like, and may be connected to the upper channel UCH. The upper channel UCH may penetrate or extend into the upper word lines 333 to 338. The upper channel UCH may include a data storage layer, a channel layer, a buried insulating layer, and the like, and the channel layer of the upper channel UCH may be electrically connected to the first metal wiring 350c and the second metal wiring 360c. As the channel length becomes longer, it may be difficult to form a channel with a constant width for process reasons. The nonvolatile memory device 500 according to some embodiments of the present invention may include a channel with improved width uniformity through the lower channel LCH and the upper channel UCH formed in a sequential process.

As shown in A2, when the channel structure CH is formed to include the lower channel LCH and the upper channel UCH, the word lines located near the boundary of the lower channel LCH and upper channel UCH may be dummy word lines. For example, a word line 332 and a word line 333, which form the boundary between the lower channel LCH and the upper channel UCH, may be dummy word lines. In this case, data may not be stored in the memory cells connected to the dummy word line. Alternatively, the number of pages corresponding to memory cells connected to the dummy word lines may be smaller than the number of pages corresponding to the memory cells connected to the general word lines. The voltage level applied to the dummy word lines may be different from the voltage level applied to the common word lines, thereby reducing an influence of uneven channel width between the lower channel LCH and the upper channel UCH on the operation of the memory device.

On the other hand, in A2, although the number of lower word lines 331 and 332 through which the lower channel LCH penetrates is shown to be smaller than the number of upper word lines 333 to 338 through which the upper channel UCH penetrates, this is an example, and the present invention is not limited thereto. As another example, the number of lower word lines through which the lower channel LCH penetrates or extends into may be formed to be equal to or greater than the number of upper word lines through which the upper channel UCH penetrates or extends into. Also, the structure and connection relationship of the channel structure CH disposed in the first cell region CELL1 described above may be similarly applied to the channel structure CH disposed in the second cell region CELL2.

In the bit line bonding region BLBA, a first through electrode THV1 may be provided in the first cell region CELL1, and a second through electrode THV2 may be provided in the second cell region CELL2. As shown in FIG. 2, the first through electrode THV1 may penetrate or extend into the common source line 320 and the plurality of word lines 330. However, this is an example, and the first through electrode THV1 may further penetrate or extend into the second substrate 310. The first through electrode THV1 may include a conductive material. Alternatively, the first through electrode THV1 may include a conductive material surrounded by an insulating material. The second through electrode THV2 may also be provided in the same form and structure as those of the first through electrode THV1.

In some embodiments, the first through electrode THV1 and the second through electrode THV2 may be electrically connected through the first through metal pattern 372d and the second through metal pattern 472d. The first through metal pattern 372d may be formed at the lower end of the first upper chip including the first cell region CELL1, and the second through metal pattern 472d may be formed on the upper end of the second upper chip including the second cell region CELL2. The first through electrode THV1 may be electrically connected to the first metal wiring 350c and the second metal wiring 360c. A lower via 371d may be formed between the first through electrode THV1 and the first through metal pattern 372d, and an upper via 471d may be formed between the second through electrode THV2 and the second through metal pattern 472d. The first through metal pattern 372d and the second through metal pattern 472d may be connected by the bonding method.

Also, in the bit line bonding region BLBA, an upper metal pattern 252 may be formed on the uppermost metal layer of the peripheral circuit region PERI, and an upper metal pattern 392 having the same shape as that of the upper metal pattern 252 may be formed on the uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360c may be electrically connected to page buffers included in the peripheral circuit region PERI. For example, some of the circuit elements 220c of the peripheral circuit region PERI may provide a page buffer, and the bit line 360c may be electrically connected to the circuit elements 220c that provide a page buffer through the upper bonding metal 370c of the first cell region CELL1 and the upper bonding metal 270c of the peripheral circuit region PERI.

Subsequently, referring to FIG. 2, in the word line bonding region WLBA, the word lines 330 of the first cell region CELL1 may extend along the second direction (X-axis direction) parallel to the upper side of the second substrate 310, and may be connected to a plurality of cell contact plugs (341-347; 340). A first metal wiring 350b and a second metal wiring 360b may be connected in sequence above the cell contact plugs 340 connected to the word lines 330. The cell contact plugs 340 may be connected to the peripheral circuit region PERI through the upper bonding metal 370b of the first cell region CELL1 and the upper bonding metal 270b of the peripheral circuit region PERI in the word line bonding region WLBA.

The cell contact plugs 340 may be electrically connected to row decoders included in the peripheral circuit region PERI. For example, some of the circuit elements 220b of the peripheral circuit region PERI provide a row decoder, and the cell contact plugs 340 may be electrically connected to circuit elements 220b that provide the row decoder through the upper bonding metal 370b of the first cell region CELL1 and the upper bonding metal 270b of the peripheral circuit region PERI. In some embodiments, the operating voltage of the circuit elements 220b that provide the row decoder may be different than the operating voltage of the circuit elements 220c that provide the page buffer. For example, the operating voltage of the circuit elements 220c that provide the page buffer may be greater than the operating voltage of the circuit elements 220b that provide the row decoder.

Similarly, in the word line bonding region WLBA, the word lines 430 of the second cell region CELL2 may extend along the second direction (X-axis direction) parallel to the upper side of the third substrate 410, and may be connected to the plurality of cell contact plugs (441-447; 440). The cell contact plugs 440 may be connected to the peripheral circuit region PERI through the upper metal pattern of the second cell region CELL2, the lower and upper metal patterns of the first cell region CELL1, and the cell contact plug 348.

In the word line bonding region WLBA, an upper bonding metal 370b is formed in the first cell region CELL1, and an upper bonding metal 270b may be formed in the peripheral circuit region PERI. The upper bonding metal 370b of the first cell region CELL1 and the upper bonding metal 270b of the peripheral circuit region PERI may be electrically connected to each other by the bonding method. The upper bonding metal 370b and the upper bonding metal 270b may be formed of aluminum, copper, tungsten, or the like.

In the external pad bonding region PA, a lower metal pattern 371e may be formed in the lower part of the first cell region CELL', and an upper metal pattern 472a may be formed in the upper part of the second cell region CELL2. The lower metal pattern 371e of the first cell region CELL1 and the upper metal pattern 472a of the second cell region CELL2 may be connected in the external pad bonding region PA by the bonding method. Similarly, an upper metal pattern 372a may be formed in the upper part of the first cell region CELL1, and an upper metal pattern 272a may be formed in the upper part of the peripheral circuit region PERI. The upper metal pattern 372a of the first cell region CELL1 and the upper metal pattern 272a of the peripheral circuit region PERI may be connected by the bonding method.

Common source line contact plugs 380 and 480 may be disposed in the external pad bonding region PA. The common source line contact plugs 380 and 480 may be formed of conductive materials such as metal, metal compound or doped polysilicon. The common source line contact plug 380 of the first cell region CELL1 may be electrically connected to the common source line 320, and the common source line contact plug 480 of the second cell region CELL2 may be electrically connected to the common source line 420. A first metal wiring 350a and a second metal wiring 360a are sequentially stacked above the common source line contact plug 380 of the first cell region CELL', and a first metal wiring 450a and a second metal wiring 460a may be sequentially stacked above the common source line contact plug 480 of the second cell region CELL2.

Input/Output (I/O) pads 205, 405 and 406 may be disposed in the external pad bonding region PA. Referring to FIG. 2, the lower insulating film 201 may cover the lower side of the first substrate 210, and the first I/O pad 205 may be formed on the lower insulating film 201. The first I/O pad 205 may be connected to at least one of the plurality of circuit elements 220a disposed in the peripheral circuit region PERI through the first I/O contact plug 203, and may be separated from the first substrate 210 by the lower insulating film 201. A side insulating film may be disposed between the first I/O contact plug 203 and the first substrate 210 to electrically separate the first I/O contact plug 203 and the first substrate 210.

An upper insulating film 401 that covers the upper side of the third substrate 410 may be formed on the third substrate 410. A second I/O pad 405 and/or a third I/O pad 406 may be disposed on the upper insulating film 401. The second I/O pad 405 may be connected to at least one of the plurality of circuit elements 220a disposed in the peripheral circuit region PERI through the second I/O contact plugs 403 and 303, and the third I/O pad 406 may be connected to at least one of the plurality of circuit elements 220a disposed in the peripheral circuit region PERI through the third I/O contact plugs 404 and 304.

In some embodiments, the third substrate 410 may not be disposed in a region in which the I/O contact plug is disposed. For example, as shown in B, the third I/O contact plug 404 may be separated from the third substrate 410 in a direction parallel to the upper side of the third substrate 410 (e.g., X-axis direction), may penetrate or extend into the interlayer insulating layer 415 of the second cell region CELL2, and may be connected to the third I/O pad 406. In this case, the third I/O contact plugs 404 may be formed by various processes.

As an example, as shown in B1, the third I/O contact plug 404 may be formed to extend in the third direction (Z-axis direction) and increase in diameter toward the upper insulating film 401. That is, the diameter of the channel structure CH described in A1 is formed to decrease toward the upper insulating film 401, whereas the diameter of the third I/O contact plug 404 may be formed to increase toward the upper insulating film 401. For example, the third I/O contact plug 404 may be formed after the second cell region CELL2 and the first cell region CELL1 are coupled by the bonding method.

Further, as an example, as shown in B2, the third I/O contact plug 404 may be formed to extend in the third direction (Z-axis direction), and may be formed to have a diameter that decreases toward the upper insulating film 401. That is, the diameter of the third I/O contact plug 404 may be formed to decrease toward the upper insulating film 401, like the channel structure CH. For example, the third I/O contact plug 404 may be formed together with the cell contact plug 440, before bonding coupling of the second cell region CELL2 and the first cell region CELL1.

In other embodiments, the I/O contact plugs may be disposed to overlap the third substrate 410. For example, as shown in C, the second I/O contact plug 403 may be formed to penetrate or extend into the interlayer insulating layer 415 of the second cell region CELL2 in the third direction (Z-axis direction), and may be electrically connected to the second I/O pad 405 through the third substrate 410. In this case, the connecting structure between the second I/O contact plug 403 and the second I/O pad 405 may be realized by various methods.

As an example, as shown in C1, an opening 408 that penetrates the third substrate 410 may be formed, and the second I/O contact plug 403 may be directly connected to the second I/O pad 405 through the opening 408 formed in the third substrate 410. In this case, the diameter of the second I/O contact plug 403 may be formed to increase toward the second I/O pad 405, as shown in C1. However, this is an example, and the diameter of the second I/O contact plug 403 may be formed to decrease toward the second I/O pad 405.

As an example, as shown in C2, the opening 408 that penetrates the third substrate 410 may be formed, and a contact 407 may be formed in the opening 408. One end of the contact 407 may be connected to the second I/O pad 405, and the other end thereof may be connected to the second I/O contact plug 403. Therefore, the second I/O contact plug 403 may be electrically connected to the second I/O pad 405 through the contact 407 in the opening 408. In this case, as shown in C2, the diameter of the contact 407 may increase toward the second I/O pad 405, and the diameter of the second I/O contact plug 403 may be formed to decrease toward the second I/O pad 405. For example, the third I/O contact plug 403 may be formed together with the cell contact plug 440 before bonding of the second cell region CELL2 and the first cell region CELL', and the contact 407 may be formed after bonding of the second cell region CELL2 and the first cell region CELL1.

Also, as an example, as shown in C3, a stopper 409 may be further formed on the upper side of the opening 408 of the third substrate 410 compared to C2. The stopper 409 may be a metal wiring formed on the same layer as the common source line 420. However, this is an example, and the stopper 409 may be a metal wiring formed on the same layer as at least one of the word lines 430. The second I/O contact plug 403 may be electrically connected to the second I/O pad 405 through the contact 407 and the stopper 409.

On the other hand, in the similar manner to the second and third I/O contact plugs 403 and 404 of the second cell region CELL2, each of the second and third I/O contact plugs 303 and 304 of the first cell region CELL1 may be formed to have a diameter that decreases toward the lower metal pattern 371e or increases toward the lower metal pattern 371e.

Meanwhile, according to some embodiments, a slit 411 may be formed in the third substrate 410. For example, the slit 411 may be formed at any position in the external pad bonding region PA. In as example, as shown in D, the slit 411 may be located between the second I/O pad 405 and the cell contact plugs 440 in a plan view. However, this is an example, and the slit 411 may be formed such that the second I/O pad 405 is positioned between the slit 411 and the cell contact plugs 440 in a plan view.

As an example, the slit 411 may be formed to penetrate or extend into the third substrate 410, as shown in D1. The slit 411 may be used, for example, to prevent fine cracking of the third substrate 410 when forming the opening 408. However, this is an example, and the slit 411 may be formed with a depth of about 60 to 70% with respect to the thickness of the third substrate 410.

Also, as an example, a conductive material 412 may be formed in the slit 411, as shown in D2. The conductive material 412 may be used, for example, to discharge leakage current generated during driving of circuit elements in the external pad bonding region PA to the outside (e.g., external to the nonvolatile memory device 500). In this case, the conductive material 412 may be connected to an external ground line.

Also, as an example, an insulating material 413 may be formed in the slit 411, as shown in D3. The insulating material 413 may be formed to electrically separate, for example, the second I/O pad 405 and the second I/O contact plug 403 disposed in the external pad bonding region PA from the word line bonding region WLBA. By forming the insulating material 413 inside the slit 411, it may be possible to block the influence of the voltage supplied through the second I/O pad 405 on the metal layer disposed on the third substrate 410 inside the word line bonding region WLBA.

Meanwhile, according to some embodiments, the first to third I/O pads 205, 405, and 406 may be selectively formed. For example, the nonvolatile memory device 500 may be implemented to include only the first I/O pad 205 disposed on the first substrate 210, include only the second I/O pad 405 disposed on the third substrate 410 or include only the third I/O pad 406 disposed on the upper insulating film 401.

Meanwhile, according to some embodiments, at least one of the second substrate 310 of the first cell region CELL1 and the third substrate 410 of the second cell region CELL2 may be used as a sacrificial substrate, and may be removed completely or only partially before or after the bonding process. Additional films may be deposited after the substrate removal. For example, the second substrate 310 of the first cell region CELL1 may be removed before or after bonding the peripheral circuit region PERI and the first cell region CELL1, and an insulating film that covers the upper side of the common source line 320 or a conductive film for connection may be removed. Similarly, the third substrate 410 of the second cell region CELL2 may be removed before or after bonding the first cell region CELL1 and the second cell region CELL2, and the upper insulating film 401 that covers the upper side of the common source line 420 or a conductive film for connection may be formed.

At this time, a net crack detection circuit and a ring crack detection circuit may be disposed inside the word line bonding region WLBA.

Specifically, the net crack detection circuit may include crack detection metal wirings 750a and 760a, and a crack detection upper bonding metal 772a disposed in the cell region CELL1. In addition, the net crack detection circuit may include crack detection metal wirings 630a and 640a and a crack detection upper bonding metal 670a disposed in the peripheral circuit region PERI.

That is, the net crack detection circuit may be electrically connected to the crack detection transistor 620a through the crack detection metal wirings 750a and 760a, the crack detection upper bonding metal 772a, the crack detection upper bonding metal 670a, and the crack detection metal wirings 630a and 640a which are sequentially stacked in the third direction Z.

The crack detection metal wirings 750a and 760a, the crack detection upper bonding metal 772a, the crack detection upper bonding metal 670a, and the crack detection metal wirings 630a and 640a may be formed of aluminum, copper, tungsten, or the like.

The crack detection upper bonding metal 772a of the first cell region CELL1 and the crack detection upper bonding metal 670a of the peripheral circuit region PERI may be connected by the bonding method.

The crack detection transistor 620a may check whether a crack has occurred in the cell region CELL1 on the basis of electrical signals transferred through the crack detection metal wirings 750a and 760a.

Also, the crack detection transistor 620a may check whether a crack has occurred in the bonding region in which the peripheral circuit region PERI and the cell region CELL1 are connected in the third direction Z, on the basis of electrical signals transferred through the crack detection upper bonding metals 772a and 670a. The bonding region may be defined as, for example, a region in which structures 272a, 372a, 270b, 370b, 670a, 772a, 270c, 370c, 252, and 392 for bonding the peripheral circuit region PERI and the cell region CELL1 are disposed. For example, a contact portion between the peripheral circuit region PERI and the cell region CELL1 may be defined as the bonding region. The bonding region may include an uppermost end of the peripheral circuit region PERI and an uppermost end of the cell region CELL1.

Also, the crack detection transistor 620a may check whether a crack has occurred in the peripheral circuit region PERI on the basis of electrical signals transferred through the crack detection metal wirings 630a and 640a.

The ring crack detection circuit may include a crack detection metal wiring 760b disposed in the cell region CELL1. Also, the ring crack detection circuit may include a crack detection metal wiring 640b disposed in the peripheral circuit region PERI.

The crack detection metal wirings 760b and 640b may extend in the second direction Y.

The ring crack detection circuit may confirm whether a crack has occurred in the cell region CELL1 on the basis of the electrical signal transferred through the crack detection metal wiring 760b.

Also, the ring crack detection circuit may check whether a crack has occurred in the peripheral circuit region PERI on the basis of the electrical signal transferred through the crack detection metal wiring 640b.

More specifically, the crack detection metal wirings 760b and 640b extending in the second direction Y are not electrically connected to each other, but may be connected to different circuit elements to operate electrically.

The crack detection metal wiring 760b may be formed, for example, on the plurality of word lines 330, but is not electrically connected to the plurality of word lines 330. Also, the crack detection metal wiring 760b may be formed, for example, between a plurality of metal wirings 360b.

That is, the crack detection metal wiring 760b may be formed in a layer directly adjacent in the third direction Z to the layer in which the structure 370b for forming the bonding region is disposed.

The crack detection metal wiring 640b may be formed, for example, between the plurality of metal lines 240b.

That is, the crack detection metal wiring 640b may be formed on a layer directly adjacent in the third direction Z to the layer in which the structure 270b for forming the bonding region is disposed.

The crack detection metal wirings 760b and 640b may be formed of aluminum, copper, tungsten, or the like.

Through the nonvolatile memory device according to some embodiments including the net crack detection circuit and the ring crack detection circuit described above, it is possible to detect an exact location as to whether the crack occurs in the cell region CELL1, occurs in the peripheral circuit region PERI and/or occurs in the bond region.

Figure 3:
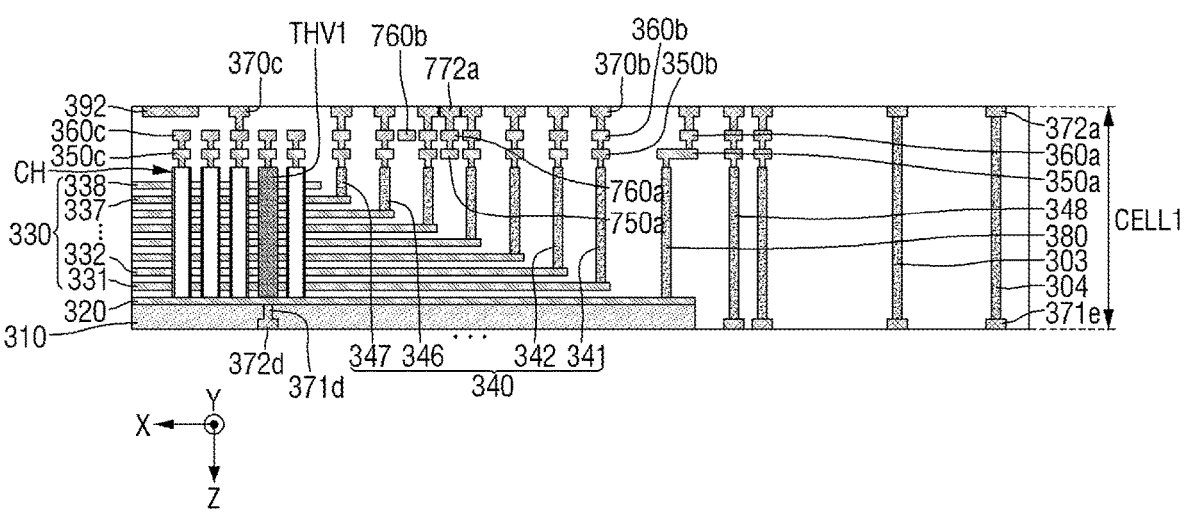
FIGS. 3 and 4 are cross-sectional views during a fabricating process for explaining an intermediate step of fabricating the nonvolatile memory device of FIG. 2.
Figure 4:
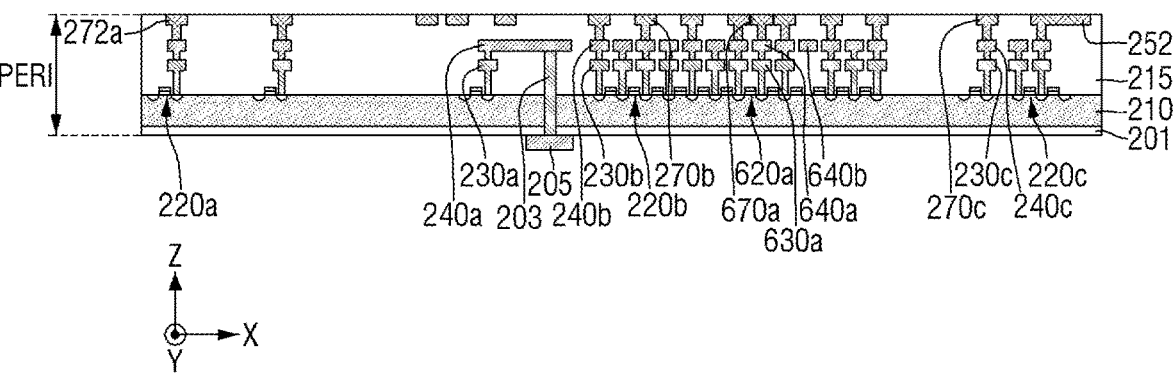

FIGS. 3 and 4 are cross-sectional views during a fabricating process for explaining an intermediate step of fabricating the nonvolatile memory device of FIG. 2.

First, referring to FIG. 3, a cell region CELL1 may be formed, in which crack detection metal wirings 750a and 760a, a crack detection upper bonding metal 772a, and a crack detection metal wiring 760b sequentially stacked in the third direction Z are formed. For example, the crack detection metal wirings 750a and 760a and the crack detection upper bonding metal 772a may be formed to be stacked in the third direction Z.

Next, referring to FIG. 4, a peripheral circuit region PERI may be formed, in which the crack detection metal wirings 630a and 640a, the crack detection upper bonding metal 670a and the crack detection metal wiring 640b sequentially stacked in the third direction Z are formed. For example, the crack detection metal wirings 630a and 640a and the crack detection upper bonding metal 670a may be formed to be stacked in the third direction Z.

Thereafter, the cell region CELL1 of FIG. 3 and the peripheral circuit region PERI of FIG. 4 may be bonded in the third direction Z, and the second cell region CELL2 may be bonded to the cell region CELL1 to form the nonvolatile memory device of FIG. 2.

Hereinafter, repeated explanations of the aforementioned explanations will not be provided, and differences will be mainly explained.

Figure 5:
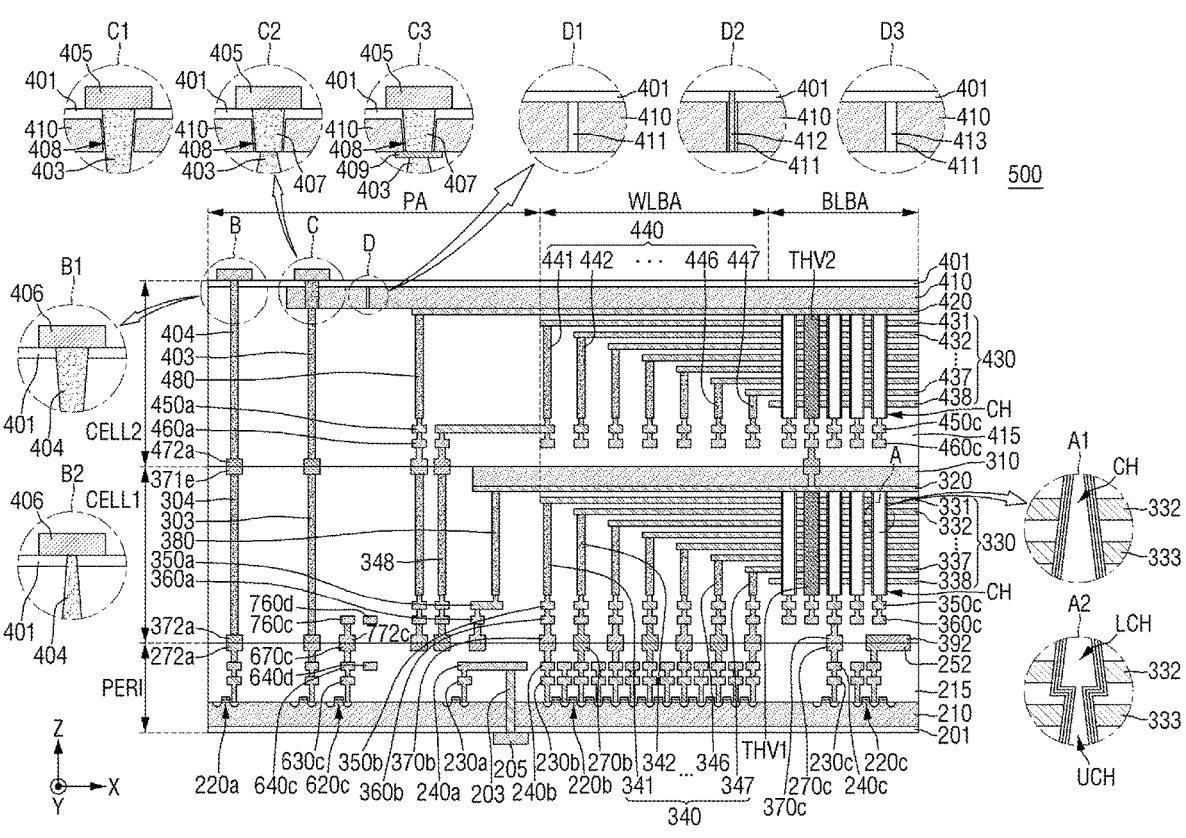
FIGS. 5 and 6 are cross-sectional views for explaining other nonvolatile memory devices according to some embodiments.
Figure 6:
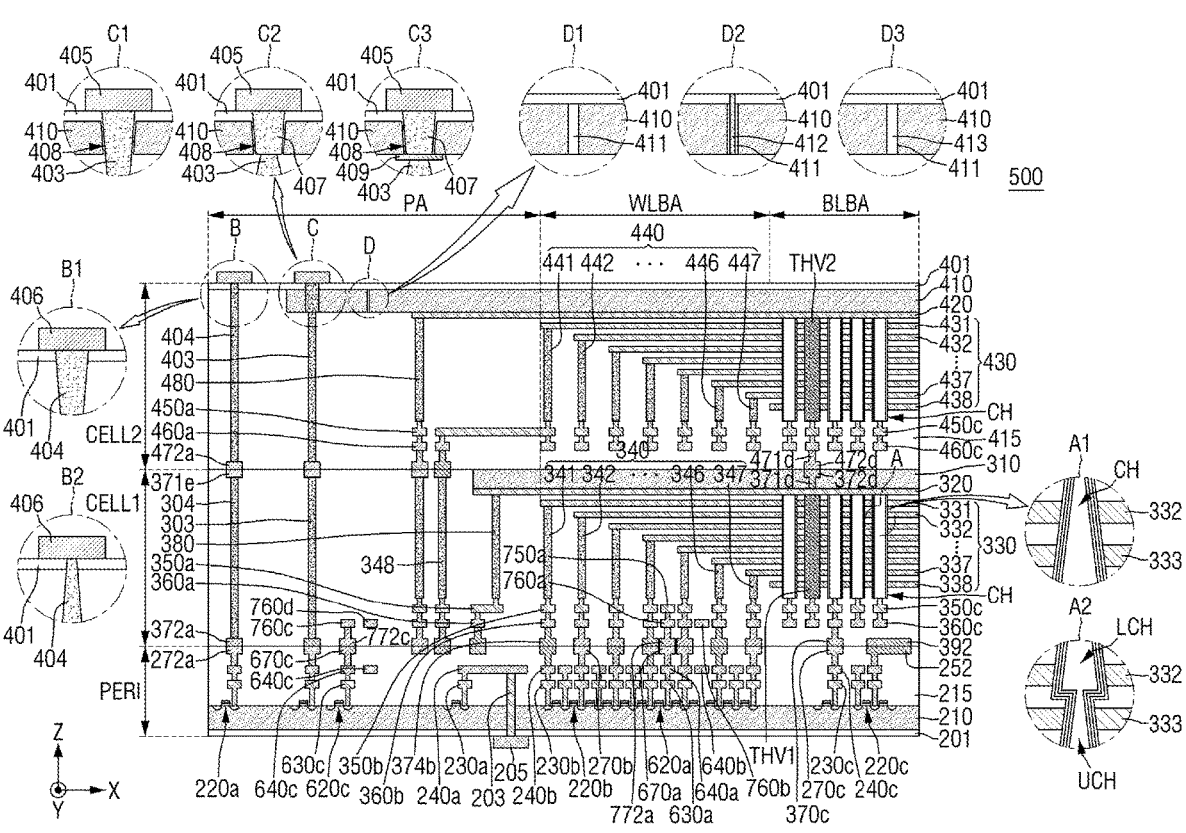

FIGS. 5 and 6 are cross-sectional views for explaining other nonvolatile memory devices according to some embodiments.

Referring to FIG. 5, unlike the nonvolatile memory device of FIG. 2 according to some embodiments, a ring crack detection circuit and a net crack detection circuit may be formed in the external pad bonding region PA.

Specifically, the net crack detection circuit may include crack detection metal wirings 760c and a crack detection upper bonding metal 772c disposed in the cell region CELL1. In addition, the net crack detection circuit may include crack detection metal wirings 630c and 640c and a crack detection upper bonding metal 670c disposed in the peripheral circuit region PERI.

That is, the net crack detection circuit may be electrically connected to the crack detection transistor 620c through the crack detection metal wiring 760c, the crack detection upper bonding metal 772c, the crack detection upper bonding metal 670c, and the crack detection metal wirings 630c and 640c, which are sequentially stacked in the third direction Z.

The crack detection metal wiring 760c, the crack detection upper bonding metal 772c, the crack detection upper bonding metal 670c, and the crack detection metal wirings 630c and 640c may be formed of aluminum, copper, tungsten, or the like.

The crack detection upper bonding metal 772c of the first cell region CELL1 and the crack detection upper bonding metal 670c of the peripheral circuit region PERI may be connected by the bonding method.

The crack detection transistor 620c may check whether a crack has occurred in the cell region CELL1 on the basis of an electrical signal transferred through the crack detection metal wiring 760c.

Also, the crack sense transistor 620c may check whether a crack has occurred in the bonding region in which the peripheral circuit region PERI and the cell region CELL1 are connected in the third direction Z, on the basis of electrical signals transferred through the crack detection upper bonding metals 772c and 670c. The bonding region may be defined as, for example, a region in which structures 272a, 372a, 270b, 370b, 670c, 772c, 270c, 370c, 252, and 392 for bonding the peripheral circuit region PERI and the cell region CELL1 are disposed.

Also, the crack detection transistor 620c may check whether a crack has occurred in the peripheral circuit region PERI, on the basis of electrical signals transferred through the crack detection metal wirings 630c and 640c.

The ring crack detection circuit may include a crack detection metal wiring 760d disposed in the cell region CELL1. The ring crack detection circuit may also include a crack detection metal wiring 640d disposed in the peripheral circuit region PERI.

The crack detection metal wirings 760d and 640d may extend in the second direction Y.

The ring crack detection circuit may check whether a crack has occurred in the cell region CELL1 on the basis of an electrical signal transferred through the crack detection metal wiring 760d.

Also, the ring crack detection circuit may confirm whether a crack has occurred in the peripheral circuit region PERI on the basis of the electrical signal transferred through the crack detection metal wiring 640d.

More specifically, the crack detection metal wirings 760d and 640d extending in the second direction Y are not electrically connected to each other, but may be electrically connected to different circuit elements to operate electrically.

The crack detection metal wiring 760d may be formed in a layer directly adjacent in the third direction Z to the layer on which the structure 370b for forming the bonding region is disposed.

The crack detection metal wiring 640d may be formed in a layer directly adjacent in the third direction Z to the layer on which the structure 270b for forming the bonding region is disposed.

The crack detection metal wirings 760d and 640d may be formed of aluminum, copper, tungsten, or the like.

The nonvolatile memory device according to some embodiments is not limited to this diagram, and the net crack detection circuit and the ring crack detection circuit may be disposed at any position in the external pad bonding region PA. For example, the net crack detection circuit and the ring crack detection circuit may be disposed between a plurality of I/O contact plugs 303 and 304.

Through the nonvolatile memory device according to some embodiments including the net crack detection circuit and the ring crack detection circuit described above, it is possible to detect an exact location as to whether the crack occurs in the cell region CELL1, occurs in the peripheral circuit region PERI and/or occurs in the bond region.

Referring to FIG. 6, unlike the nonvolatile memory devices of FIGS. 2 and 5 according to some embodiments, the ring crack detection circuit and the net crack detection circuit may be formed in both the external pad bonding region PA and the word line bonding region WLBA.

Figure 7:
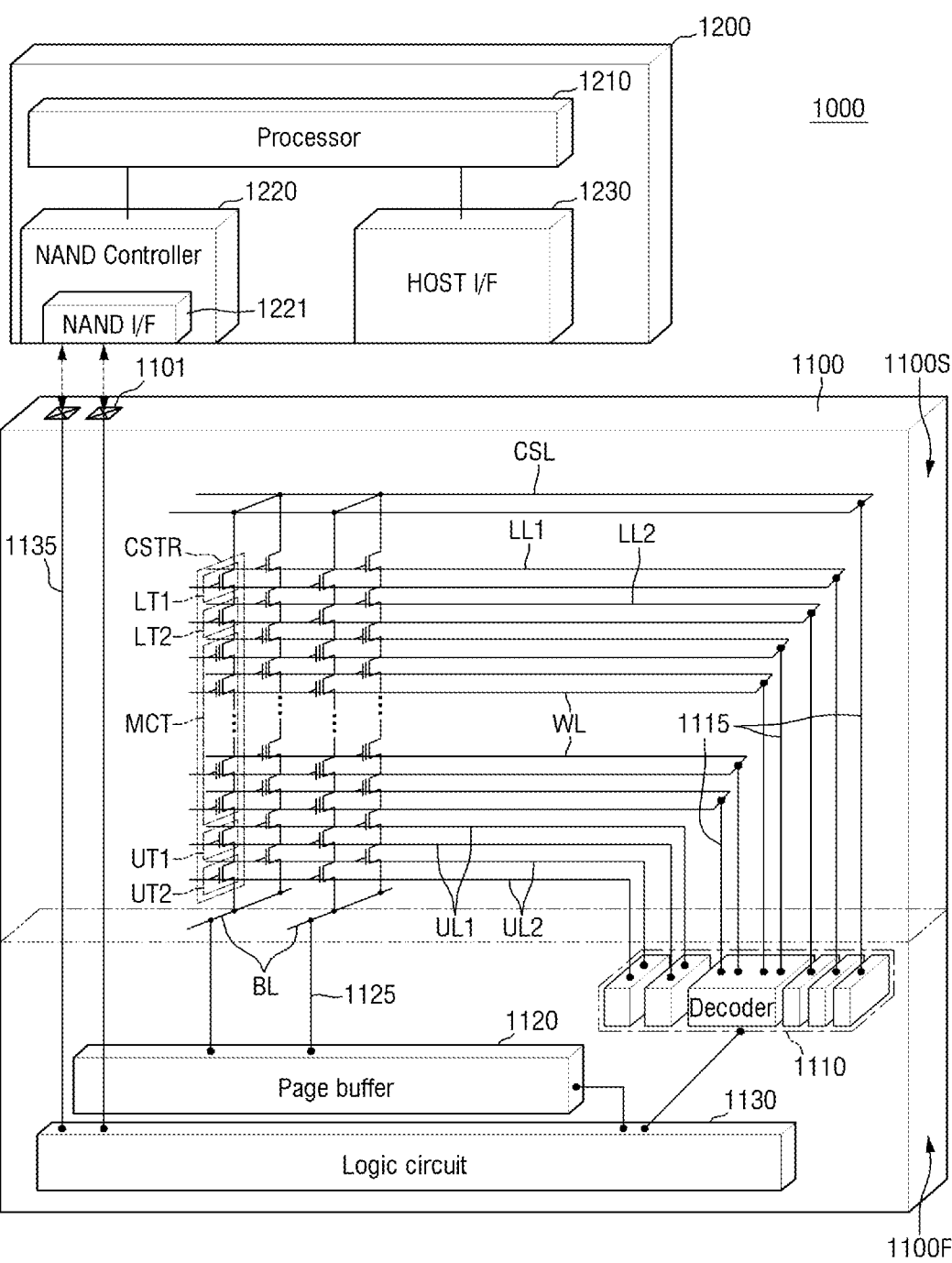
FIG. 7 is a diagram schematically showing a memory system including the nonvolatile memory device according to some embodiments.

FIG. 7 is a diagram schematically showing a memory system including the nonvolatile memory device according to some embodiments.

Referring to FIG. 7, a memory system 1000 according to example embodiments of the present invention may include a nonvolatile memory device 1100, and a controller 1200 electrically connected to the nonvolatile memory device 1100. The memory system 1000 may be a storage device that includes one or multiple nonvolatile memory devices 1100, or an electronic device that includes the storage device. For example, the memory system 1000 may be an SSD device (solid state drive device), a USB (Universal Serial Bus), a computing system, a medical device or a communication device that includes one or multiple nonvolatile memory devices 1100.

The nonvolatile memory device 1100 may be a nonvolatile memory device, and may be, for example, the NAND flash memory device explained above using FIGS. 1 to 6. The nonvolatile memory device 1100 may include a first structure 1100F, and a second structure 1100S on the first structure 1100F. In the example embodiments, the first structure 1100F may also be disposed next to the second structure 1100S. The first structure 1100F may be a peripheral circuit structure that includes a decoder circuit 1110, a page buffer 1120, and a logic circuit 1130. The second structure 1100S may be a memory cell structure that includes a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each memory cell string CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously changed depending on the embodiments.

In the example embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 through first connection wirings 1115 that extend from the inside of the first structure 1100F to the second structure 1100S. The bit lines BL may be electrically connected to the page buffer 1120 through second connection wirings 1125 that extend from the inside of the first structure 1100F to the second structure 1100S.

In the first structure 1100F, the decoder circuit 1110 and the page buffer 1120 may execute the control operation on at least one selection memory cell transistor among the plurality of memory cell transistors MCT. The decoder circuit 1110 and the page buffer 1120 may be controlled by the logic circuits 1130. The nonvolatile memory device 1100 may communicate with the controller 1200 through an I/O pad 1101 that is electrically connected to the logic circuit 1130. The I/O pad 1101 may be electrically connected to the logic circuit 1130 through an I/O connection wiring 1135 extending from the inside of the first structure 1100F to the second structure 1100S.

The controller 1200 may include a processor 1210, a NAND controller 1220, and a host interface 1230. According to some embodiments, the memory system 1000 may include a plurality of nonvolatile memory devices 1100, and in this case, the controller 1200 may control the plurality of nonvolatile memory devices 1100.

The processor 1210 may control the operation of the overall memory system 1000 including the controller 1200. The processor 1210 may operate according to a predetermined firmware, and may control the NAND controller 1220 to access the nonvolatile memory device 1100. The NAND controller 1220 may include a NAND interface 1221 that processes communication with the nonvolatile memory device 1100. Control command for controlling the nonvolatile memory device 1100, data to be recorded in the memory cell transistors MCT of the nonvolatile memory device 1100, data to be read from the memory cell transistors MCT of the nonvolatile memory device 1100, and the like may be transmitted through the NAND interface 1221. The host interface 1230 may provide a communication function between the memory system 1000 and an external host. When the control command is received from the external host through the host interface 1230, the processor 1210 may control the nonvolatile memory device 1100 in response to the control command.

Figure 8:
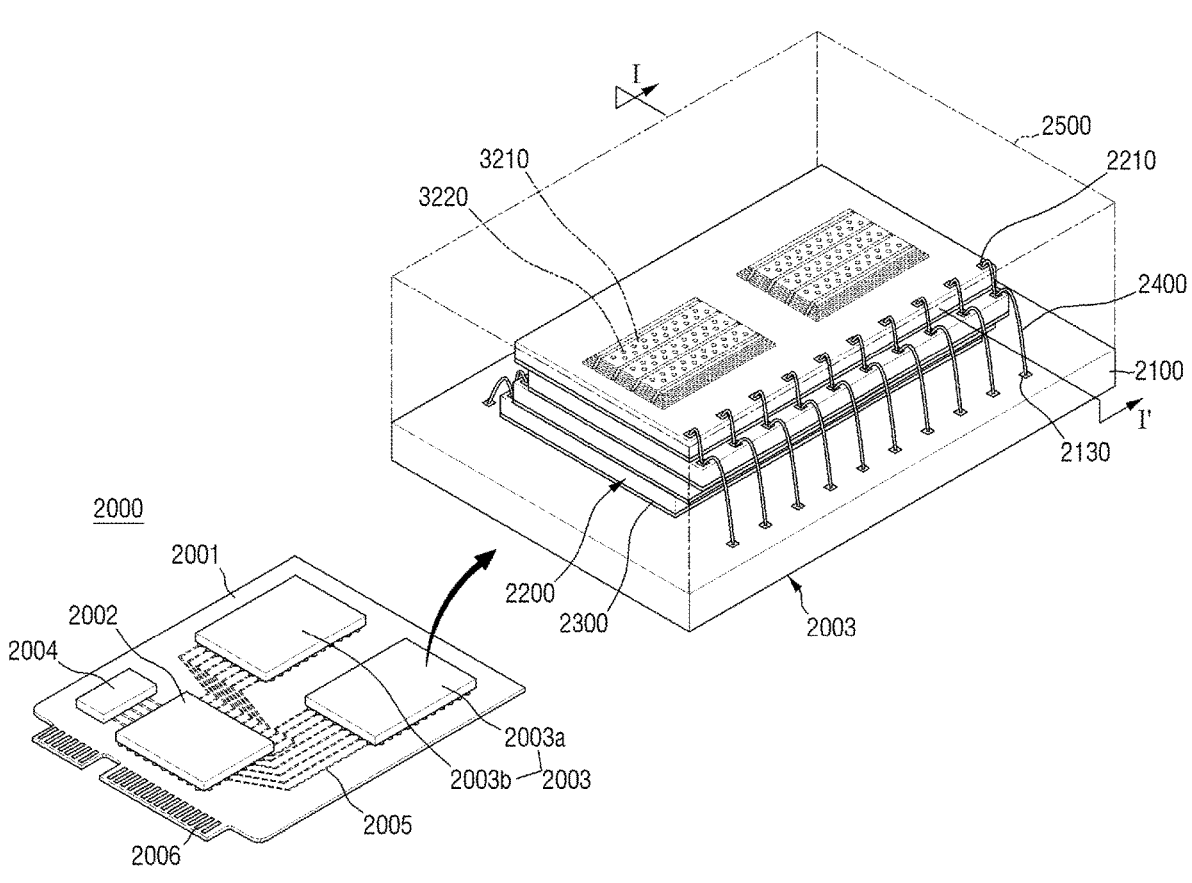
FIG. 8 is a perspective view that schematically shows a memory system including the nonvolatile memory device according to some embodiments.

FIG. 8 is a perspective view that schematically shows a memory system including the nonvolatile memory device according to some embodiments.

Referring to FIG. 8, the memory system 2000 according to some embodiments may include a main board 2001, a controller 2002 mounted on the main board 2001, one or more semiconductor packages 2003, and a DRAM 2004. The semiconductor package 2003 and the DRAM 2004 may be connected to the controller 2002 by wiring patterns 2005 formed on the main board 2001.

The main board 2001 may include a connector 2006 including a plurality of pins coupled to an external host. In the connector 2006, the number and placement of the plurality of pins may vary depending on the communication interface between the memory system 2000 and the external host. In the example embodiments, the memory system 2000 may communicate with the external host according to any one of interfaces such as M-Phy for USB (Universal Serial Bus), PCI-Express (Peripheral Component Interconnect Express), SATA (Serial Advanced Technology Attachment), and UFS (Universal Flash Storage). In the example embodiments, the memory system 2000 may operate by power supplied from the external host through the connector 2006. The memory system 2000 may further include a PMIC (Power Management Integrated Circuit) that distributes the power supplied from the external host to the controller 2002 and the semiconductor package 2003.

The controller 2002 may record or write data in the semiconductor package 2003 or read data from the semiconductor package 2003, and may improve the operating speed of the memory system 2000.

The DRAM 2004 may be a buffer memory for relieving a speed difference between the semiconductor package 2003, which is a data storage space, and the external host. The DRAM 2004 included in the memory system 2000 may also operate as a kind of cache memory, and may also provide a space for temporarily storing data in the control operation on the semiconductor package 2003. When the DRAM 2004 is included in the memory system 2000, the controller 2002 may further include a DRAM controller for controlling the DRAM 2004, in addition to a NAND controller for controlling the semiconductor package 2003.

The semiconductor package 2003 may include a first semiconductor package 2003a and a second semiconductor package 2003b that are spaced apart from each other. The first semiconductor package 2003a and the second semiconductor package 2003b may each be a semiconductor package that includes a plurality of semiconductor chips 2200. The first semiconductor package 2003a and the second semiconductor package 2003b may each include a package substrate 2100, semiconductor chips 2200 on the package substrate 2100, adhesive layers 2300 disposed on the lower sides of each of the semiconductor chips 2200, a connecting structure 2400 for electrically connecting the semiconductor chips 2200 and the package substrate 2100, and a molding layer 2500 that covers the semiconductor chips 2200 and the connecting structure 2400 on the package substrate 2100.

The package substrate 2100 may be a printed circuit board that includes upper pads 2130. Each semiconductor chip 2200 may include an I/O pad 2210. The I/O pad 2210 may correspond to the I/O pad 1101 of FIG. 7. Each of the semiconductor chips 2200 may include a plurality of word lines 3210 and memory channel structures 3220. Each of the semiconductor chips 2200 may include the semiconductor memory device described above referring to FIGS. 1 to 6.

The package substrate 2100 may include a package substrate body 2120, package upper pads 2130 on a top surface of the package substrate body 2120, lower pads 2125 disposed or exposed on a bottom surface of the package substrate body 2120, and internal wiring lines 2135 that lie in the package substrate body 2120 and electrically connect the upper pads 2130 to the lower pads 2125. The upper pads 2130 may be electrically connected to connection structures 2400. The lower pads 2125 may be connected through conductive connectors 2800.

In the example embodiments, the connecting structure 2400 may be a bonding wire that electrically connects the I/O pad 2210 and the package upper pads 2130. Therefore, in each of the first semiconductor package 2003a and the second semiconductor package 2003b, the semiconductor chips 2200 may be electrically connected to each other in a bonding wire manner, and may be electrically connected to the package upper pads 2130 of the package substrate 2100. According to some embodiments, in each of the first semiconductor package 2003a and the second semiconductor package 2003b, the semiconductor chips 2200 may be electrically connected to each other by a connecting structure including a through electrode (Through Silicon Via, TSV) instead of the connecting structure 2400 of a bonding wire type.

In the example embodiments, the controller 2002 and the semiconductor chips 2200 may be included in a single package. In the example embodiments, the controller 2002 and the semiconductor chips 2200 may be mounted on a separate interposer substrate different from the main board 2001, and the controller 2002 and the semiconductor chips 2200 may also be connected to each other by the wiring formed on the interposer substrate.

Figure 9:
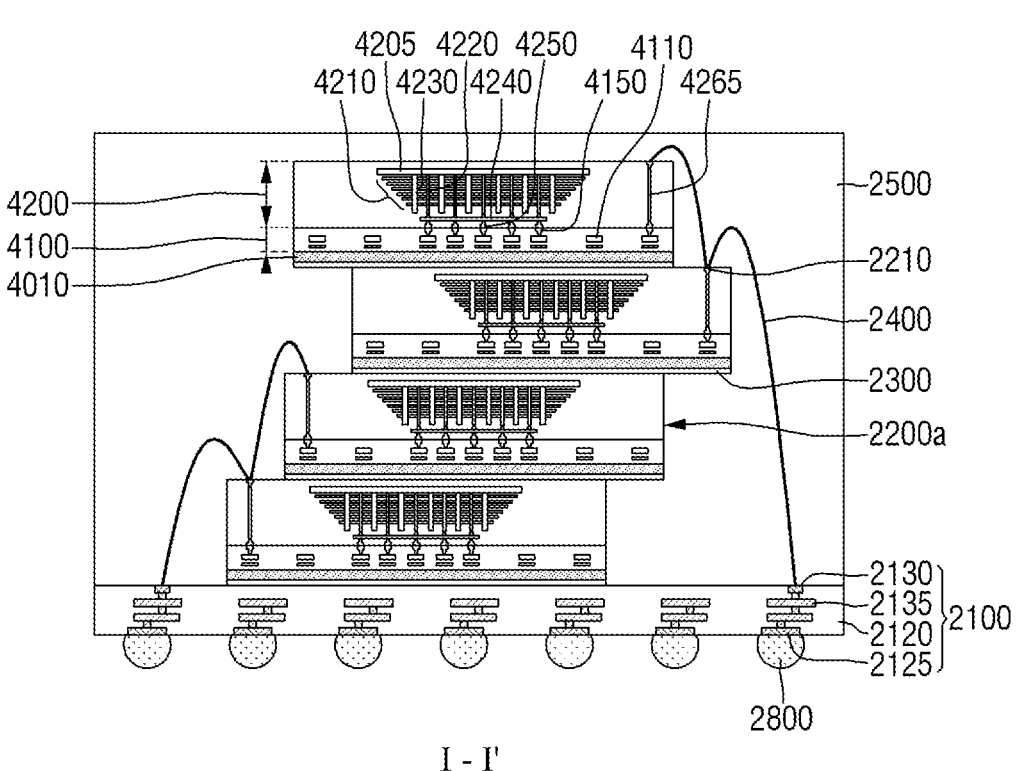
FIG. 9 is a diagram which schematically shows a region of the semiconductor package 2003 according to some embodiments taken along a cut line I-I'.

FIG. 9 is a diagram which schematically shows a region of the semiconductor package 2003 according to some embodiments taken along a cut line I-I'.

Referring to FIG. 9, in the semiconductor package 2003A, each of the semiconductor chips 2200a may include a semiconductor substrate 4010, a first structure 4100 on the semiconductor substrate 4010, and a second structure 4200 on the first structure 4100 and joined to the first structure 4100 by the wafer bonding manner.

The first structure 4100 may include a peripheral circuit region including the peripheral wiring 4110 and the first joining structures 4150. The second structure 4200 may include a common source line 4205, a plurality of word lines 4210 between the common source line 4205 and the first structure 4100, memory channel structures 4220 and a separation structure 4230 penetrating or extending into the plurality of word lines 4210, and a second joining structure 4250 electrically connected to each of the memory channel structures 4220 and word lines (WL of FIG. 7) of the plurality of word lines 4210. For example, the second joining structures 4250 may be electrically connected to each of the memory channel structures 4220 and the word lines (WL of FIG. 7) through bit lines 4240 electrically connected to the memory channel structures 4220 and gate connection wirings 4265 electrically connected to the word lines (WL of FIG. 7). The first joining structures 4150 of the first structure 4100 and the second joining structures 4250 of the second structure 4200 may be joined, while being in contact with each other. Joined portions between the first joining structures 4150 and the second joining structures 4250 may be formed of, for example, copper (Cu).

At this time, the net crack detection circuit and the ring crack detection circuit described above through FIGS. 1 to 6 may also be formed in a bonding region in which the first structure 4100 and the second structure 4200 are bonded. Each of the semiconductor chips 2200a may further include I/O pads 2210 electrically connected to the peripheral wirings 4110 of the first structure 4100.

The semiconductor chips 2200 of FIG. 8 and the semiconductor chips 2200a of FIG. 9 may be electrically connected to each other by a connecting structure 2400 in the form of bonding wire. However, in the example embodiments, the semiconductor chips within one semiconductor package, such as the semiconductor chips 2200 of FIG. 8 and the semiconductor chips 2200a of FIG. 9 may be electrically connected to each other by a connecting structure including the through electrode TSV.

As used herein, the words "include/comprise", "contain", "have", and any other variations specify the presence of the stated features, steps, operations, elements, and/or components, but do not preclude the presence or addition of one or more other features, steps, operations, elements, components, and/or groups thereof.

In concluding the detailed description, those skilled in the art will appreciate that many variations and modifications may be made to the embodiments without substantially departing from the principles of the present inventive concept. Therefore, the disclosed embodiments of the invention are used in a generic and descriptive sense only and not for purposes of limitation.

What is claimed is:

1. A nonvolatile memory device comprising:
a plurality of word lines that extend in a first direction;
a plurality of cell contact plugs that are electrically connected to the plurality of word lines and extend in a second direction intersecting the first direction;
a net crack detection circuit that is on the plurality of word lines and is not in contact with the plurality of word lines; and
a ring crack detection circuit that is on the plurality of word lines and is not in contact with the plurality of word lines, wherein the net crack detection circuit is electrically connected to a crack detection transistor in a peripheral circuit region,
the ring crack detection circuit includes a first crack detection metal wiring that extends in a third direction intersecting the first direction and the second direction, and a second crack detection metal wiring that extends in the third direction, and
the first crack detection metal wiring is on the plurality of word lines and is not in contact with the plurality of word lines, and the second crack detection metal wiring is in the peripheral circuit region.

2. The nonvolatile memory device of claim 1, wherein the plurality of word lines and the plurality of cell contact plugs are in a cell region,
wherein the peripheral circuit region and the cell region are connected to each other in the second direction,
wherein a contact portion between the peripheral circuit region and the cell region is defined as a bonding region, and
wherein the bonding region includes an uppermost end of the peripheral circuit region and an uppermost end of the cell region.

3. The nonvolatile memory device of claim 2, wherein the net crack detection circuit comprises:
a first crack detection upper bonding metal at the uppermost end of the peripheral circuit region; and
a second crack detection upper bonding metal at the uppermost end of the cell region, and
wherein the first crack detection upper bonding metal and the second crack detection upper bonding metal are electrically connected to each other.

4. The nonvolatile memory device of claim 1, further comprising:
a plurality of metal wirings electrically connected to the plurality of cell contact plugs and stacked in the second direction,
wherein the first crack detection metal wiring is between respective ones of the plurality of metal wirings.

5. The nonvolatile memory device of claim 1, wherein the peripheral circuit region comprises:
a plurality of circuit elements; and
a plurality of metal wirings electrically connected to the plurality of circuit elements and stacked in the second direction, and
wherein the second crack detection metal wiring is between respective ones of the plurality of metal wirings.

6. The nonvolatile memory device of claim 1, wherein the first crack detection metal wiring and the second crack detection metal wiring are not electrically connected to each other.

7. The nonvolatile memory device of claim 1, wherein the net crack detection circuit comprises:
a plurality of metal wirings electrically connected to the crack detection transistor and stacked in the second direction; and
a first crack detection upper bonding metal electrically connected to the plurality of metal wirings.

8. The nonvolatile memory device of claim 7, wherein the net crack detection circuit further comprises a second crack detection upper bonding metal that is in a cell region,
wherein the cell region includes the plurality of word lines and the plurality of cell contact plugs, and
wherein the first crack detection upper bonding metal and the second crack detection upper bonding metal are electrically connected.

9. A nonvolatile memory device comprising:

a substrate that extends in a first direction;

a plurality of lower metal patterns spaced apart from the substrate in the first direction;

a plurality of I/O contact plugs that are electrically connected to the plurality of lower metal patterns and extend in a second direction intersecting the first direction; and a net crack detection circuit and a ring crack detection circuit between respective ones of the plurality of I/O contact plugs, wherein the net crack detection circuit is electrically connected to a crack detection transistor in a peripheral circuit region, and wherein the ring crack detection circuit includes:

a first crack detection metal wiring that extends in a third direction intersecting the first direction and the second direction; and a second crack detection metal wiring that extends in the third direction.

10. The nonvolatile memory device of claim 9, wherein the first crack detection metal wiring and the second crack detection metal wiring are not electrically connected to each other.

11. The nonvolatile memory device of claim 9, wherein the net crack detection circuit comprises:

a plurality of metal wirings electrically connected to the crack detection transistor and stacked in the second direction; and a first crack detection upper bonding metal electrically connected to the plurality of metal wirings.

12. The nonvolatile memory device of claim 11, wherein the net crack detection circuit further comprises a second crack detection upper bonding metal in a cell region, wherein the cell region includes the substrate, the plurality of lower metal patterns, and the plurality of I/O contact plugs, and wherein the first crack detection upper bonding metal and the second crack detection upper bonding metal are electrically connected.

13. A memory system comprising:

a nonvolatile memory device; and a controller that is configured to control the nonvolatile memory device, wherein the nonvolatile memory device comprises:

a plurality of word lines that extend in a first direction;

a plurality of cell contact plugs that are electrically connected to the plurality of word lines and extend in a second direction intersecting the first direction;

a net crack detection circuit that is on the plurality of word lines and is not in contact with the plurality of word lines; and a ring crack detection circuit that is on the plurality of word lines and is not in contact with the plurality of word lines, wherein the net crack detection circuit is electrically connected to a crack detection transistor in a peripheral circuit region, wherein the ring crack detection circuit includes:

a first crack detection metal wiring that extends in a third direction intersecting the first direction and the second direction; and a second crack detection metal wiring that extends in the third direction, wherein the first crack detection metal wiring is on the plurality of word lines and is not in contact with the plurality of word lines, and wherein the second crack detection metal wiring is in the peripheral circuit region.

14. The memory system of claim 13, wherein the plurality of word lines and the plurality of cell contact plugs are in a cell region, wherein the peripheral circuit region and the cell region are connected to each other in the second direction, wherein a contact portion between the peripheral circuit region and the cell region is defined as a bonding region, and wherein the bonding region includes an uppermost end of the peripheral circuit region and an uppermost end of the cell region.

15. The memory system of claim 14, wherein the net crack detection circuit comprises:

a first crack detection upper bonding metal at the uppermost end of the peripheral circuit region; and a second crack detection upper bonding metal at the uppermost end of the cell region, and wherein the first crack detection upper bonding metal and the second crack detection upper bonding metal are electrically connected to each other.

16. The memory system of claim 13, further comprising:

a plurality of metal wirings electrically connected to the plurality of cell contact plugs and stacked in the second direction, wherein the first crack detection metal wiring is between respective ones of the plurality of metal wirings.

17. The memory system of claim 13, wherein the peripheral circuit region comprises:

a plurality of circuit elements; and a plurality of metal wirings electrically connected to the plurality of circuit elements and stacked in the second direction, and wherein the second crack detection metal wiring is between respective ones of the plurality of metal wirings.

18. The memory system of claim 13, wherein the first crack detection metal wiring and the second crack detection metal wiring are not electrically connected to each other.

19. The memory system of claim 13, wherein the net crack detection circuit comprises:

a plurality of metal wirings electrically connected to the crack detection transistor and stacked in the second direction; and a first crack detection upper bonding metal electrically connected to the plurality of metal wirings.

20. The memory system of claim 19, wherein the net crack detection circuit further comprises a second crack detection upper bonding metal that is in a cell region, wherein the cell region includes the plurality of word lines and the plurality of cell contact plugs, and wherein the first crack detection upper bonding metal and the second crack detection upper bonding metal are electrically connected.

\* \* \* \* \*